(12) United States Patent
Dhawan et al.

(10) Patent No.: US 6,262,890 B1
(45) Date of Patent: Jul. 17, 2001

(54) COMPUTER SYSTEM UTILIZING FRONT AND BACKSIDE MOUNTED MEMORY CONTROLLER CHIPSETS

(75) Inventors: Sudhir Dhawan; Mark Wayne Mueller; Peter Matthew Thomsen; Lucinda Mae Walter, all of Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/271,946

(22) Filed: Mar. 18, 1999

(51) Int. Cl.[7] .................................................. H05K 7/10
(52) U.S. Cl. .................... 361/690; 361/736; 361/720; 361/765; 174/15.1; 257/723
(58) Field of Search ...................... 361/683, 684, 361/688, 689, 690–697, 700–712, 717–727, 732–737, 756–765, 785, 749, 752, 790–792; 257/706–727, 686, 698, 756; 174/15.1, 15.2, 16.3, 252; 365/52; 395/307; 29/834

(56) References Cited

U.S. PATENT DOCUMENTS

| | | | |
|---|---|---|---|
| 4,489,363 | * | 12/1984 | Goldgerg .............................. 361/383 |
| 5,107,397 | * | 4/1992 | Azar ...................................... 361/384 |
| 5,701,507 | * | 12/1997 | Bonneau et al. ...................... 395/800 |
| 5,941,447 | * | 8/1999 | Chu et al. ......................... 228/180.21 |
| 5,999,437 | * | 12/1999 | Chengson et al. ..................... 365/52 |
| 6,021,048 | * | 2/2000 | Smith .................................. 361/736 |

FOREIGN PATENT DOCUMENTS

| | | | |
|---|---|---|---|
| 0392892-A1 | * | 3/1989 | (EP) ............................... G11C/5/00 |
| 0446367-A1 | * | 4/1989 | (EP) .............................. G05B/11/01 |
| 0398188-A2 | * | 5/1989 | (EP) ............................... G11C/5/00 |

* cited by examiner

*Primary Examiner*—Leo P. Picard
*Assistant Examiner*—Michael Datskovsky
(74) *Attorney, Agent, or Firm*—Bracewell & Patterson, LLP

(57) ABSTRACT

A device for solving the electrical, physical, architectural and thermal challenges associated with designing a computer system is disclosed. A memory controller chipset having two or more chips mounted on opposite sides of a system planar helps balance the thermal profile of the system and achieve the strict spacing requirements of advanced computer processors relative to the memory controller chipset. Although the chips are staggered on opposite sides of the system planar, the adjacent edges of the chips substantially align with one another to minimize their separation.

11 Claims, 2 Drawing Sheets

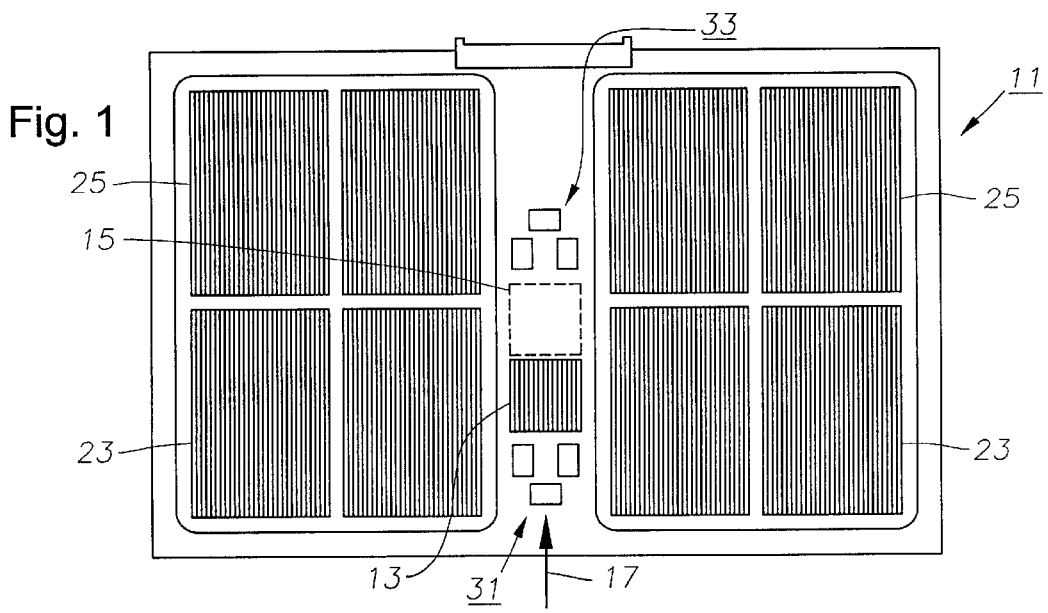
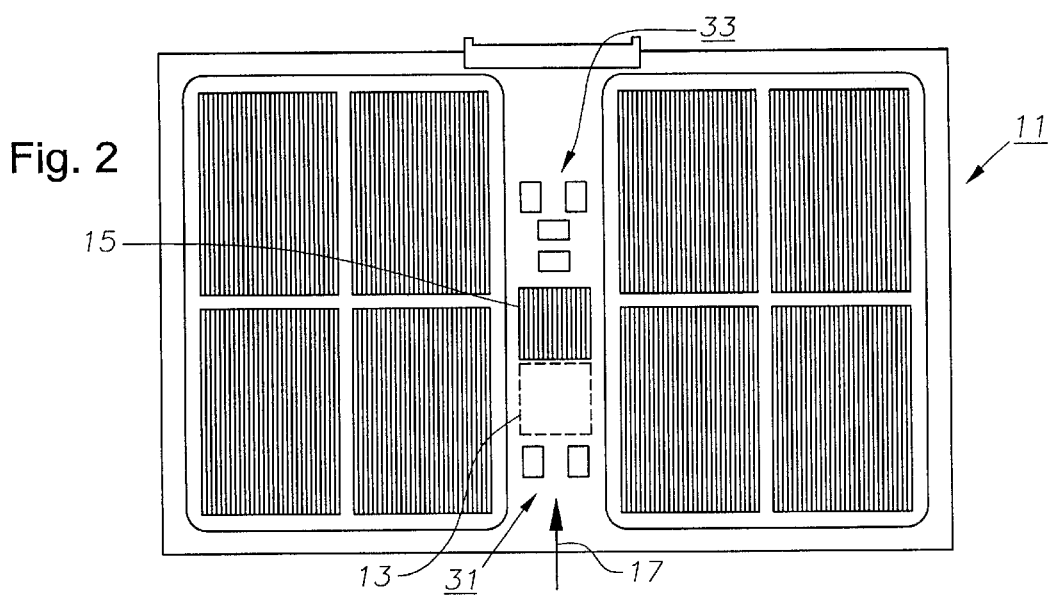
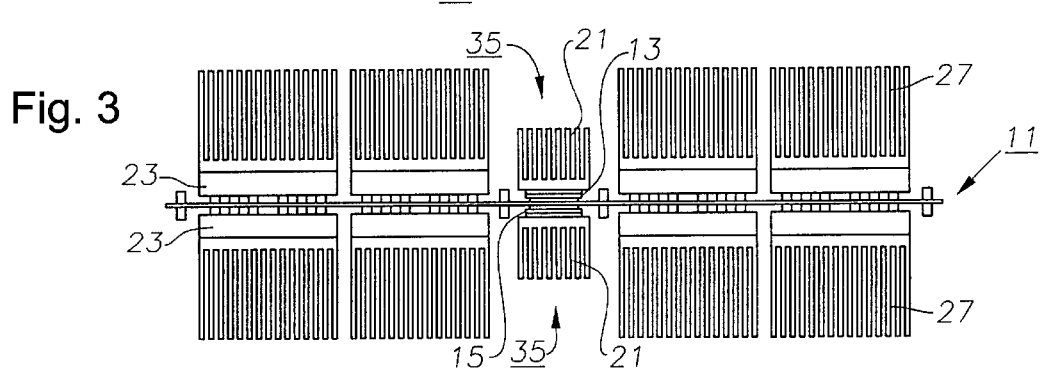

COMPUTER SYSTEM UTILIZING FRONT AND BACKSIDE MOUNTED MEMORY CONTROLLER CHIPSETS

BACKGROUND OF THE INVENTION

1. Technical Field

This invention relates in general to computer system architecture and packaging and in particular to an apparatus and method for optimizing computer system packaging.

2. Background Art

Computer processor architectures featuring a 64-bit instruction set incorporate advanced techniques such as explicit parallelism, predication and speculation. These techniques enable a much higher degree of instruction-level parallelism and enable some processors to execute more instructions per clock cycle to deliver superior performance relative to current out-of-order based RISC processors.

Unfortunately, computer systems which utilize these architectures have been very difficult to design due to the high performance, power and thermal requirements of the processors and memory controller chipsets. The systems demand a very high performance memory and IO subsystem which increases the memory controller power dissipation such that the memory controller chipset power dissipation is expected to exceed the power dissipation of the highest performance microprocessors. In addition, the bandwidth requirements of some processors requires pincount intensive memory controller chipset implementations, especially for systems such as 8-way symmetric multiprocessor systems. High pincount chipsets typically require multiple chips to create the memory controller. One problem with partitioning memory control functions is that each chip consumes enormous amounts of power and requires advanced thermal solutions to keep the individual chips running at reliable junction temperatures. Moreover, other support components such as clock drivers, IO bridges and memory subsystems, are also running with higher power dissipation, thus creating a very difficult thermal challenge at the system level. Finally, many processors are placing extremely tight physical constraints on the system planar layout, leaving very little room for the memory controller chipset and supporting logic.

Due to these factors, the multiple chips are required to be as close to one another as possible while still allowing room for their respective heatsink attachments. The spacing limitations do not allow adequate airflow for cooling the chips and other components. The heatsink attachments are typically so large that the separation between the chips negatively affects the electrical symmetry of the system.

Thus, in the prior art, most systems utilize a cooling methodology of spreading the memory controller chipset so that they are either not in line with each other with respect to the direction of airflow in the enclosure, or if they must be in line, that the spacing of the chips, the heatsink size and the airflow requirements are increased to reduce the downstream component's preheated air temperature. This adds to the cost of the system and also makes the design more difficult to implement from a signal timing standpoint, given the increased physical separation of the components. These limitations are particularly problematic since some of these systems cannot withstand further component separation, increased heatsink size or increased airflow.

SUMMARY OF THE INVENTION

A device for solving the electrical, physical, architectural and thermal challenges associated with designing a computer system is disclosed. A memory controller chipset having two or more chips mounted on opposite sides of a system planar helps balance the thermal profile of the system and achieve the strict spacing requirements of advanced computer processors relative to the memory controller chipset. Although the chips are staggered on opposite sides of the system planar, the adjacent edges of the chips substantially align with one another to minimize their separation.

BRIEF DESCRIPTION OF THE DRAWINGS

FIG. 1 is a top view of a first embodiment of a system planar constructed in accordance with the invention.

FIG. 2 is a bottom view of the system planar of FIG. 1.

FIG. 3 is a side view of the system planar of FIG. 1.

BEST MODE FOR CARRYING OUT THE INVENTION

Figure 4:
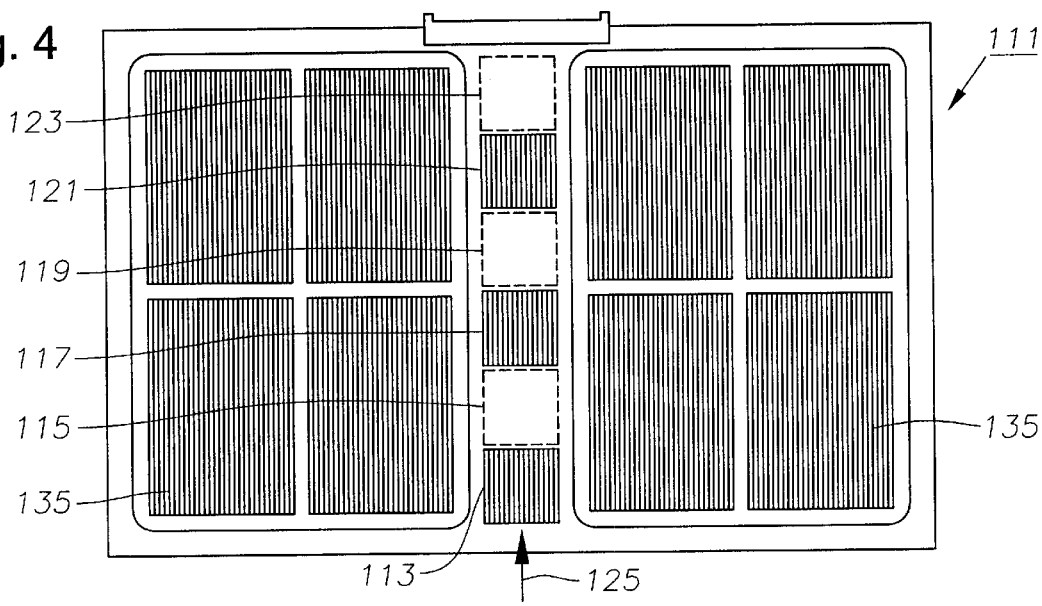
FIG. 4 is a top view of a second embodiment of the system planar of FIG. 1.

Referring to FIGS. 1–3, a first embodiment of a system planar 11 or printed circuit board (PCB) is shown. Although the designs disclosed in this specification are tailored for 64-bit processor architecture, and intended to be applied to an 8-way symmetric multiprocessor system, it should be apparent to those skilled in the art that they are not so limited, but are susceptible to various changes without departing from the scope of the invention.

System planar 11 has components on both its upper and lower surfaces FIGS. 1 and 2, respectively). The bandwidth requirements of this system require a pincount intensive memory controller chipset implementation, especially for 8-way symmetric multiprocessor systems. Consequently, the chipset is partitioned into two chips 13, 15, one for the address and control portion of the system, and one for the dataflow portion of the system. Note that chips 13, 15 are located on opposite sides of system planar 11 and that chip 15 is downstream of chip 13 relative to longitudinal airflow 17.

Chips 13, 15 consume enormous amounts of power and require advanced thermal solutions to keep the chipset running at reliable junction temperatures. Each chip 13, 15 has a conventional heatsink 21 (FIG. 3) attached to its exposed outer surface to assist in its cooling. As shown in FIGS. 1–3, heatsinks 21 are much larger than chips 13, 15 and would normally require chips 13, 15 to be further spaced apart to accommodate their size. Thus, even though chips 13, 15 are located on opposite sides of planar 11, they are more closely spaced apart from each other than would otherwise be allowable for chips mounted on the same side of planar 11. Essentially, the nearest edges of their pin footprints are immediately adjacent to one another.

System planar 11 also includes a series of high power processors 23 and power supplies 25 for each chip 13, 15 located along each of their lateral sides. Power supplies 25 are located downstream of chips 13, 15 and processors 23. Each processor 23 and power supply 25 has a conventional large heatsink 27 mounted to its exposed outer surface to assist in cooling. There are also miscellaneous upstream and downstream components 31, 33, respectively, adjacent to chips 13, 15. Components 31, 33 include such devices as clock drivers, IO bridges and memory subsystems. Like the memory controller chipset, components 23, 25, 31 and 33 are also running with higher power dissipation, thus creating a very difficult thermal challenge at the system level. Note that the components on both sides of chips 13, 15 define a central, longitudinal alley or channel 35 (FIG. 3) in which chips 13, 15 are located.

In operation, airflow 17 passes over the leading edge of system planar 11 and first encounters processors 23 on both sides of planar 11. Some of airflow 17 enters channels 35 and flows directly to chips 13, 15 at ambient temperature. Since chips 13, 15 are mounted opposite of one another, the heat that each chip dissipates does not affect the airflow encountered by the other. The miscellaneous upstream and downstream components 31, 33 contribute far less heat to airflow 17 than the adjacent processors 23 and power supplies 25. With this configuration, the separation between chips 13, 15 is minimized while the thermal efficiency of system planar 11 is maximized. The portion of the airflow circulating through the channels 35 essentially remains at ambient temperature and cools chips 13, 15 simultaneously.

Figure 5:
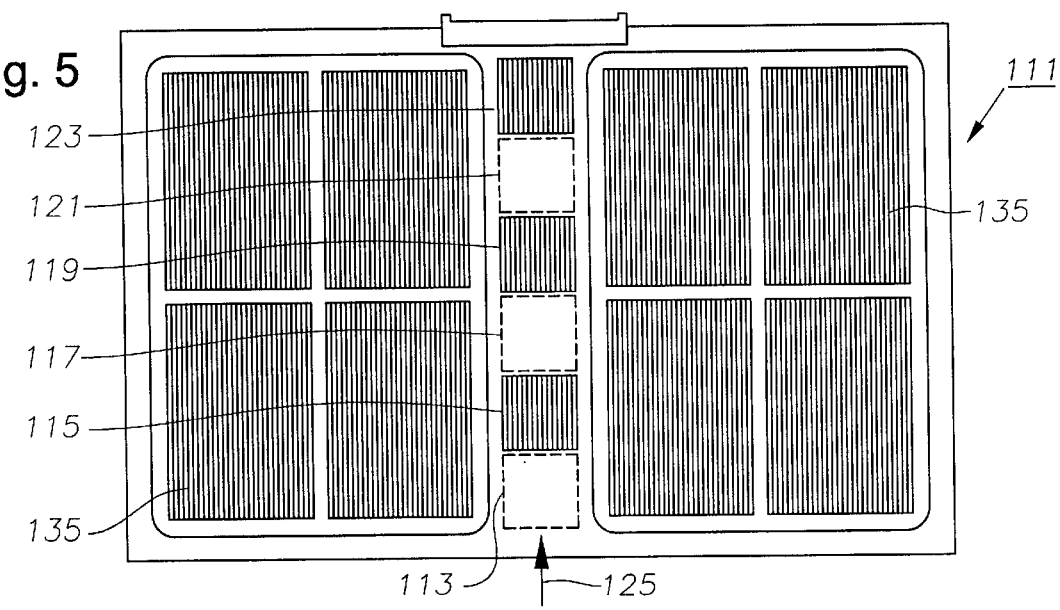
FIG. 5 is a bottom view of the system planar of FIG. 4.
Figure 6:
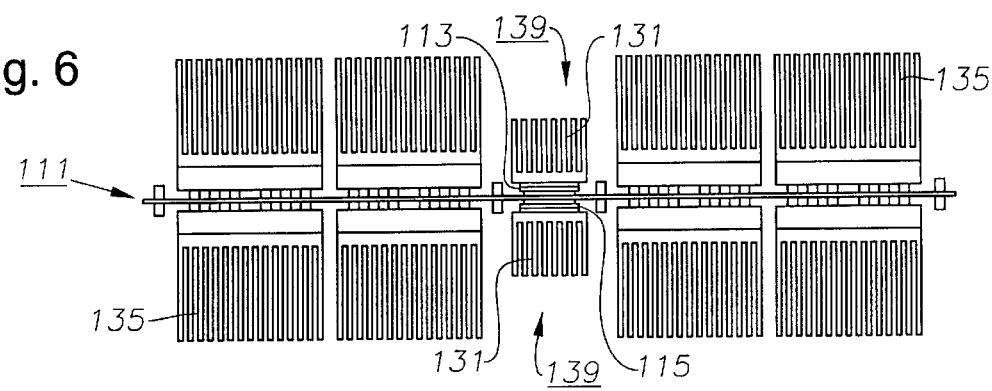
FIG. 6 is a side view of the system planar of FIG. 4.

Referring now to FIGS. 4–6, a system planar 111 depicting a second embodiment of the invention is shown. Like planar 11, system planar 111 has components on both its upper and lower surfaces with its pincount intensive memory controller chipset partitioned into multiple chips, depending upon the system requirements. In this embodiment, the chipset is divided into six chips 113, 115, 117, 119, 121 and 123 which are approximately equal in size. Note that the chipset could be divided into more or fewer chips. Some of these chips control the address and control portion of the system, while the others control the dataflow portion of the system. Chips 113, 117 and 121 are located on top of system planar 111 and chips 115, 119 and 123 are located on the bottom of planar 111. Airflow moves in the longitudinal direction indicated by arrow 125.

Each chip 113, 115, 117, 119, 121 and 123 has a conventional heatsink 131 attached to its exposed outer surface. Heatsinks 131 are much larger than their respective chips. As shown in FIGS. 4 and 5, the downstream or trailing edge of each chip, relative to airflow 131, is immediately adjacent to the leading edge of the next numerical chip even though they are located on opposite sides of planar 111. This configuration allows the chips to be symmetrically spaced apart from one another in an alternating pattern on opposite sides of planar 111. For example, the trailing edge of chip 113 is essentially aligned with the leading edge of chip 115, and the traling edge of chip 115 is essentially aligned with the leading edge of chip 117. The chips are in line with one another in the channels 139 and are spaced apart by a distance which is approximately equal to the width of one of the chips. Thus, even though chips 113–123 are located on opposite sides of planar 111, they are more closely spaced apart from each other than would otherwise be allowable for chips which were all mounted on the same side of planar 111.

System planar 111 also includes a series of high power processors and power supplies (indicated generically by reference numeral 135) for each of the chips, each of which has a conventional heatsink mounted to its exposed outer surface to assist in cooling. System planar 111 also has miscellaneous devices (not shown for clarity) such as clock drivers, IO bridges and memory subsystems. As shown in FIG. 6, components 135 are located on both sides of chips 113–123 to define each of the central channels 139 in which the chips are located.

In operation, airflow 125 passes over the leading edge of system planar 111 and first encounters components 135 on both sides of planar 111. Some of airflow 125 enters channels 139 and flows directly through and around chips 113, 117 and 121, and chips 115, 119, 123, respectively, in order. Since each set of chips is mounted opposite of the other, this configuration minimizes the electrical separation between the chips while maximizing the thermal efficiency of system planar 111.

The invention has several advantages. This invention creates a system design which balances the electrical requirement of minimal component spacing with the competing thermal requirement for maximal component spacing. By mounting the chips on opposite sides of the system planar, an extremely compact, electrically symmetrical design is achieved. This design is also the most efficient with regard to thermal performance as the airstream temperature and flow rate, heatsink size, and component separation are minimized while cooling is maximized. The chipset components receive the lowest possible ambient temperatures which also reduces the downstream air temperature. This allows higher power support logic to be placed downstream from the memory controller chipset components. This increased thermal efficiency also helps maintain reliable junction temperatures. Finally, the reliability of the system is improved because each component is running cooler, thus reducing its MTBF.

While the invention has been shown or described in only some of its forms, it should be apparent to those skilled in the art that it is not so limited, but is susceptible to various changes without departing from the scope of the invention.

What is claimed is:

1. A data processing system, comprising:
   a system planar having a first surface and an opposite second surface;
   first and second processor complexes, each having at least one microprocessor, a control logic chip for controlling data flow among the microprocessors, and a memory set associated with the control logic chip;
   the first processor complex being affixed to the first surface of the system planar and the second processor complex being affixed to the second surface of the system planar, such that the control logic chips of each of the processor complexes are located on opposite surfaces of the system planar, and adjacent edges of the control logic chips essentially align with one another on the opposite surfaces of the system planar to define an axis; and wherein
   an airflow traveling axially across both of the processor complexes in the same direction cools the processor complexes simultaneously on both surfaces of the system planar.

2. The data processing system of claim 1, further comprising:
   a plurality of processor complexes on each surface of the system planar; and wherein adjacent ones of the control logic chips are symmetrically spaced apart from one another on both surfaces of the system planar.

3. The data processing system of claim 2 wherein the adjacent ones of the control logic chips are arranged on the surfaces of the system planar in an alternating pattern between the first and second surfaces.

4. A system planar, comprising:
   a PCB having upper and lower surfaces;
   a memory controller chipset having at least two chips, each of which is mounted on one of the surfaces of the PCB opposite of the other and aligned along an axis;
   a series of processor modules associated with each of the chips on each surface of the PCB, wherein some of the processor modules are located on each lateral side of each of the chips;

a series of power modules associated with each of the chips on each surface of the PCB, wherein some of the power modules are located on each lateral side of each of the chips; and wherein an airflow circulated axially from one end of the system planar to the other cools each of the chips simultaneously on both surfaces of the PCB.

5. The system planar of claim 4 wherein the airflow remains at substantially ambient temperature as it is circulated around the chips.

6. The system planar of claim 4, further comprising a plurality of chips on each surface of the PCB, wherein adjacent ones of the chips are symmetrically spaced apart from one another on both surfaces of the PCB.

7. The system planar of claim 6 wherein the adjacent ones of the chips are arranged on the surfaces of the PCB in an alternating pattern between the upper and lower surfaces.

8. A computer system, comprising:

a PCB having a longitudinal axis, a lateral axis which is perpendicular to the longitudinal axis, a front edge on one end of the longitudinal axis, a rear edge opposite the front edge, a first surface and a second surface opposite the first surface;

a first computer chip mounted on the first surface adjacent to the longitudinal axis;

a first series of processor and power modules associated with the first computer chip and mounted to the first surface along each of its lateral sides to define a first alley therebetween in which the first computer chip is mounted;

a second computer chip mounted on the second surface adjacent to the longitudinal axis;

a second series of processor and power modules associated with the second computer chip and mounted to the second surface along each of its lateral sides to define a second alley therebetween in which the second computer chip is mounted, the second alley being longitudinally aligned with the first alley;

airflow traveling longitudinally across both surfaces of the PCB from the front edge to the rear edge including the alleys to cool the chips and both series of processor and power modules; and wherein one of the chips is positioned downstream from but immediately adjacent to the other chip without overlapping it such that a distance between the chips is minimized.

9. The computer system of claim 8 wherein the airflow which circulates through the alleys remains at a substantially ambient temperature.

10. The computer system of claim 8, further comprising a plurality of chips in each of the alleys, wherein adjacent ones of the chips are symmetrically spaced apart from one another.

11. The computer system of claim 10 wherein the adjacent ones of the chips are arranged in the alleys in an alternating pattern between the first and second surfaces without overlapping one another.

* * * * *